(12) United States Patent
Evans, Jr.

(10) Patent No.: US 7,990,749 B2
(45) Date of Patent: Aug. 2, 2011

(54) VARIABLE IMPEDANCE CIRCUIT CONTROLLED BY A FERROELECTRIC CAPACITOR

(75) Inventor: Joseph Tate Evans, Jr., Albuquerque, NM (US)

(73) Assignee: Radiant Technology, Inc., Albuquerque, NM (US)

( * ) Notice: Subject to any disclaimer, the term of this patent is extended or adjusted under 35 U.S.C. 154(b) by 220 days.

(21) Appl. No.: 12/480,645

(22) Filed: Jun. 8, 2009

(65) Prior Publication Data

US 2010/0309710 A1 Dec. 9, 2010

(51) Int. Cl.
*G11C 11/22* (2006.01)
(52) U.S. Cl. .................................. 365/145; 365/117
(58) Field of Classification Search .................. 365/145, 365/117
See application file for complete search history.

(56) References Cited

U.S. PATENT DOCUMENTS

| | | | |
|---|---|---|---|
| 4,360,896 A * | 11/1982 | Brody | ............................ 365/145 |
| 5,434,811 A | 7/1995 | Evans, Jr. et al. | |
| 5,751,627 A | 5/1998 | Ooishi | |
| 6,046,929 A | 4/2000 | Aoki et al. | |
| 6,069,816 A | 5/2000 | Nishimura | |
| 6,175,528 B1 | 1/2001 | Kye | |
| 6,240,013 B1 | 5/2001 | Nishimura | |
| 6,438,022 B2 | 8/2002 | Schlosser et al. | |
| 6,650,158 B2 | 11/2003 | Eliason | |
| 6,845,032 B2 | 1/2005 | Toyoda et al. | |
| 6,898,105 B2 | 5/2005 | Sakai et al. | |
| 6,980,459 B2 | 12/2005 | Seshadri et al. | |
| 6,990,006 B2 | 1/2006 | Ohtsuka et al. | |

OTHER PUBLICATIONS

Solarbotics™ BEAM Robotics Solar Kit #3: "Sundancer 1.3 BEAM Magbot Butterfly" documentation, 2004, Background p. 2.
Eaton, S.S.; Butler, D.B.; Parris, M.; Wilson, D.; McNeillie, H.; "A Ferroelectric Nonvolatile Memory" *Digest of the Solid State Circuit Conference*, 1988; Feb. 17-19, 1998, pp. 130-131, 329.
Eliason, J.; "Ferroelectric Nonvolatile Logic": *Integrated Ferroelectrics* v40, n1-5, 2001, pp. 3-14.
Fujimori, Y.; Nakamura, T.; Takasu, H.; "Electrical properties of nonvolatile latches for new logic application". *Integrated Ferroelectircs* v47, 2002 pp. 71-78.

* cited by examiner

*Primary Examiner* — Son T Dinh
*Assistant Examiner* — Nam T Nguyen
(74) *Attorney, Agent, or Firm* — Calvin B. Ward

(57) ABSTRACT

A memory cell comprising a ferroelectric capacitor, a variable impedance element and a conductive load is disclosed. The ferroelectric capacitor, characterized by first and second polarization states, is connected between a control terminal and a first switch terminal. The variable impedance element has an impedance between the first and second switch terminals that is determined by a signal on a control terminal. The conductive load is connected between a first power terminal and the first switch terminal. The second switch terminal is connected to a second power terminal. When a potential difference is applied between the first and second power terminals, a potential on the first switch terminal varies in a manner determined by the state of polarization of the ferroelectric capacitor.

24 Claims, 11 Drawing Sheets

VARIABLE IMPEDANCE CIRCUIT CONTROLLED BY A FERROELECTRIC CAPACITOR

BACKGROUND OF THE INVENTION

There are a number of applications in which a small number of bits of non-volatile memory are needed in an environment in which power is not always available either to program the memory or to maintain the memory. Consider a memory that monitors a line and records the occurrence of an event on the line if the event occurs. Power is only available during the time the event takes place. That is, the only power is the power in the event signal. In addition, the power in the signal may be quite small. In principle, the memory can be provided with its own power source such as a battery to power the memory and maintain the circuitry in a monitoring state. However, such arrangements require the batteries to be changed and significantly increase the cost of the memory.

Ideally, the memory should be able to monitor the line over an extended period of time and record an event on the line without using an independent power source. When power is applied to the memory at some subsequent time, the memory should assume a state that reflects whether or not an event has taken place during the period of time that the memory was not powered.

SUMMARY OF THE INVENTION

The present invention is a memory cell comprising a ferroelectric capacitor, characterized by first and second polarization states; a variable impedance element, having an impedance between first and second switch terminals that is determined by a signal on a control terminal; and a conductive load, connected between a first power terminal and the first switch terminal. The ferroelectric capacitor is connected between the control terminal and the first switch terminal, and the second switch terminal is connected to a second power terminal. When a potential difference is applied between the first and second power terminals, a potential on the first switch terminal varies in a manner determined by the state of polarization of the ferroelectric capacitor.

In one aspect of the invention, the polarization state switches from the first state to the second state in response to a potential difference being applied between the first and second power terminals. The memory cell includes a feedback circuit that resets the polarization state to the first polarization state if the polarization state switches from the first state to the second state in response to the applied potential difference. The feedback circuit includes a feedback element that measures a startup potential between the first switch terminal and the first power terminal when the potential difference is applied between the first and second power terminals. The feedback circuit sets the polarization state to the first polarization state based on the startup potential.

DETAILED DESCRIPTION OF THE PREFERRED EMBODIMENTS OF THE INVENTION

Figure 1:
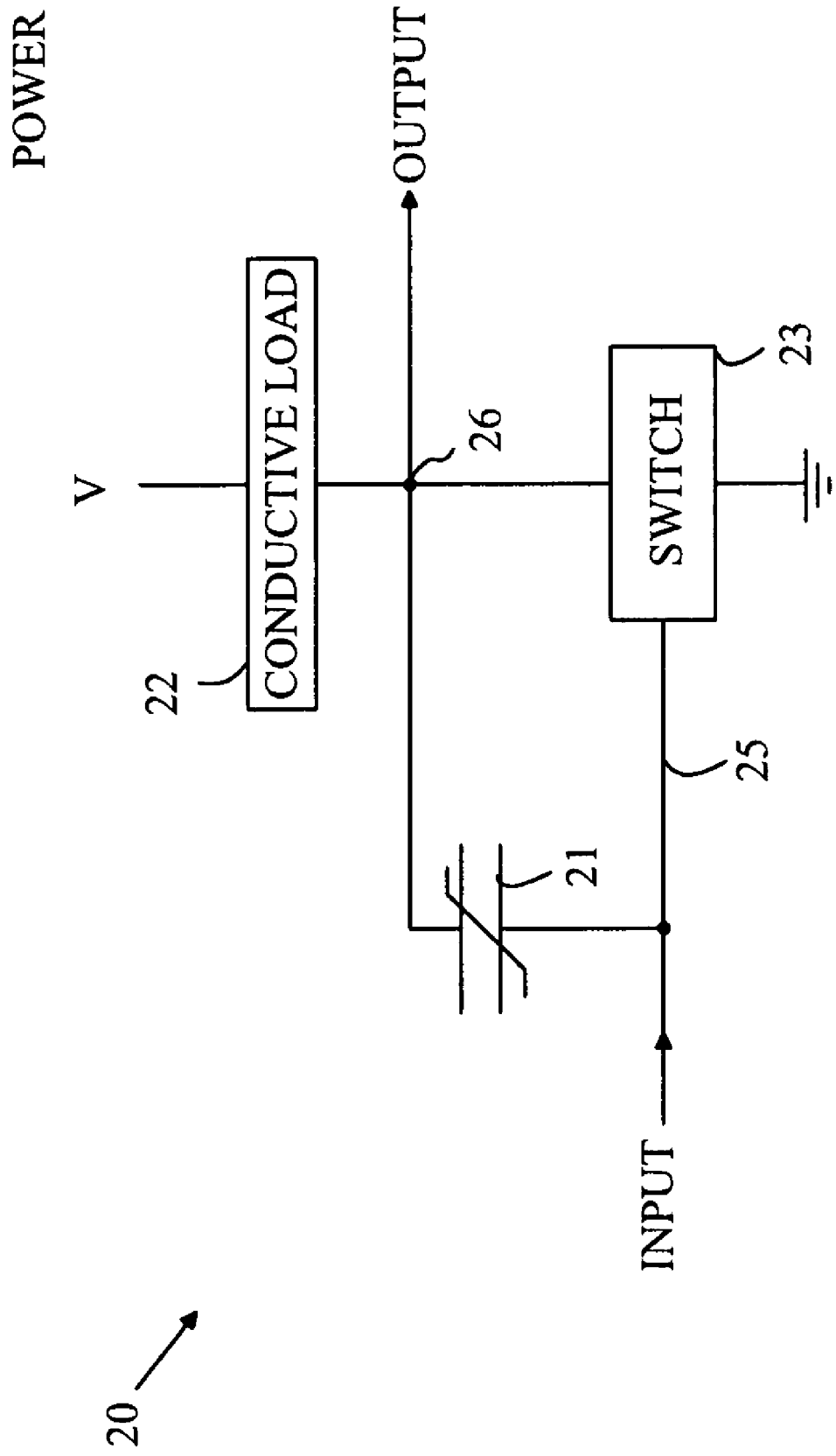
FIG. 1 is a schematic drawing of an autonomous memory circuit according to one embodiment of the present invention.

The manner in which the present invention provides its advantages can be more easily understood with reference to FIG. 1, which is a schematic drawing of an autonomous memory circuit according to one embodiment of the present invention. Autonomous memory circuit 20 includes a ferroelectric capacitor 21 and a switch 23 having a current actuated control input 25. A conductive load 22 is connected between a power rail and switch 23.

Ferroelectric capacitor 21 has a remanent polarization that can be switched by applying a voltage across ferroelectric capacitor 21. That is, in the absence of a voltage across the capacitor, the dielectric of the capacitor is electrically polarized. The dielectric has two states corresponding to the dielectric being polarized either up or down. If a voltage is applied across the ferroelectric capacitor, an electric field is created in the ferroelectric capacitor. If the field direction is the same as that of the remanent polarization, a small current flows in the circuit connecting the two plates of the ferroelectric capacitor. If, on the other hand, the applied electric field is in a direction opposite to that of the remanent polarization, the remanent polarization will change direction to conform to the new field direction, and a large current will flow in the external circuit. The magnitude of the current and the voltage at which it flows can be set by adjusting the composition, area, and thickness of the ferroelectric capacitor.

Switch 23 changes from a high impedance state to a low impedance state when a current enters control input 25. In circuit 20, it is assumed that the potential of the input line to switch 23 remains at or near ground independent of the state of the switch. To simplify the following discussion, it will be assumed that the power rail is positive and that the "up" remanent polarization state is set when the positive rail potential is applied across the plates of ferroelectric capacitor 21. However, other embodiments in which the input is referenced to power and the output is referenced to ground can be utilized.

First, assume that ferroelectric capacitor 21 is polarized in the up state. When power is turned on, switch 23 is initially in the off state; hence, the potential at node 26 will increase to V. Thus, the field applied to ferroelectric capacitor 21 will also be in the up direction, and ferroelectric capacitor 21 will not flip states. Accordingly, little current will flow into the input of switch 23, switch 23 will remain off, and the output of autonomous memory circuit 20 will quickly go to the potential of V.

Next, assume that ferroelectric capacitor 21 is polarized in the down state. When power is turned on, the applied electric field across ferroelectric capacitor 21 will be opposite to that of the remanent polarization of ferroelectric capacitor 21, and ferroelectric capacitor 21 will flip states to match the applied electric field. In this case, a large current will flow into the control input of switch 23, and switch 23 will enter the conducting state. Node 26 will drop to an intermediate state that is less than V. The specific potential will depend on the details of the switch. This intermediate state will remain until ferroelectric capacitor 21 finishes switching to its up state. At that point there will be no more charge flowing out of ferroelectric capacitor 21, and switch 23 will again enter the non-conducting state. Hence, the potential on node 26 will then increase back to V.

Thus, after power is turned on, autonomous memory circuit 20 will have a temporary output that depends on the state of polarization of ferroelectric capacitor 21 for the period of time needed for ferroelectric capacitor 21 to switch states. If ferroelectric capacitor 21 is up when power is turned on and does not switch, the output will go high almost immediately. If ferroelectric capacitor 21 is down when power is turned on and does switch, the output will go to the intermediate state for the temporary period and then will go high. After that temporary time period, the output will always be high, and ferroelectric capacitor 21 will be in the up polarization state.

Figure 2:
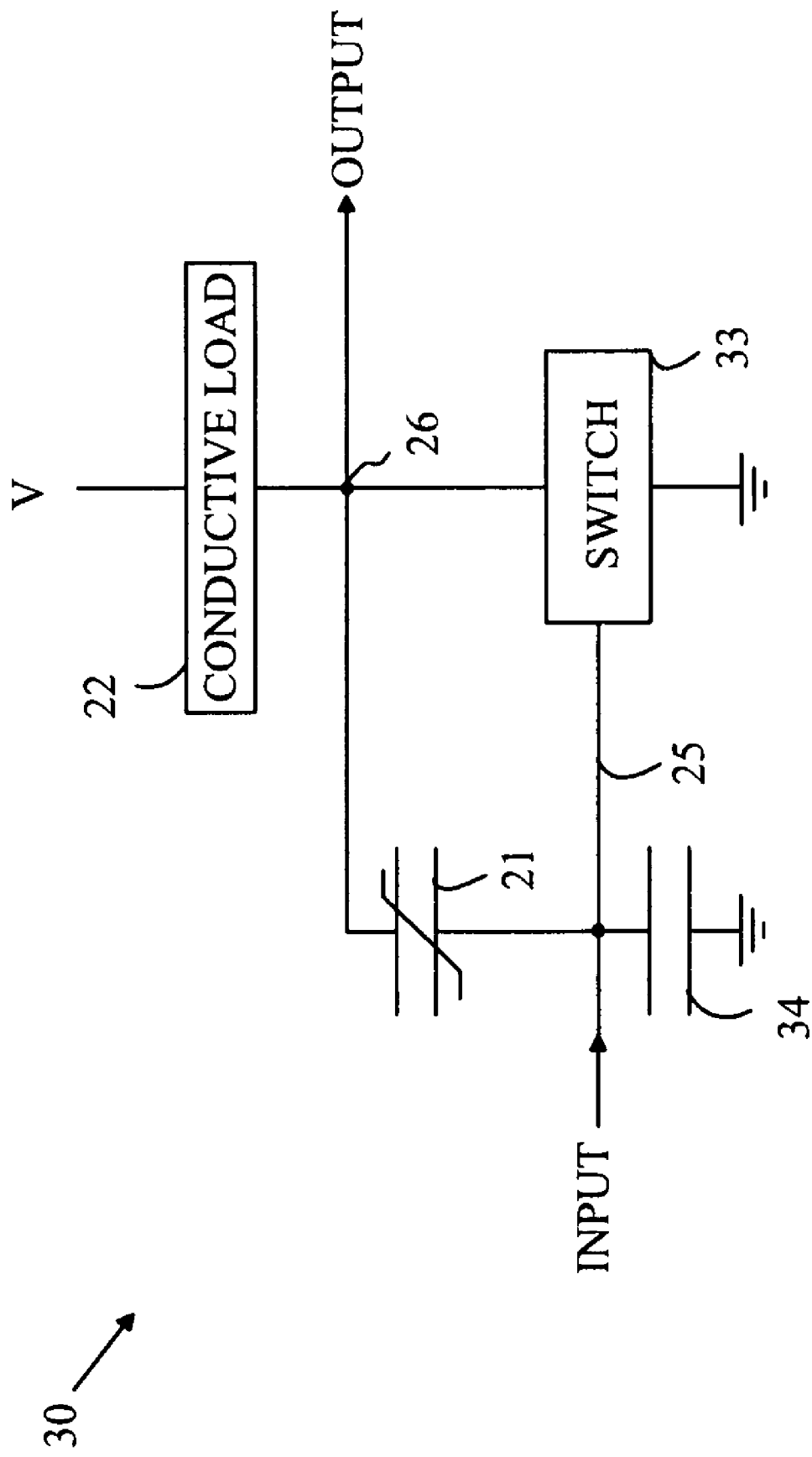
FIG. 2 is a schematic drawing of another embodiment of an autonomous memory circuit according to the present invention.

Refer now to FIG. 2, which is a schematic drawing of another embodiment of an autonomous memory circuit according to the present invention. Autonomous memory circuit 30 differs from autonomous memory circuit 20 in that switch 33 switches on a voltage signal rather than a current signal, and capacitor 34 has been added to provide a charge-to-voltage conversion. If ferroelectric capacitor 21 is in the up state when power is applied, ferroelectric capacitor 21 will remain in the up state and switch 33 will not become conductive because little charge is received by capacitor 34.

If ferroelectric capacitor 21 is in the down state when power is applied, ferroelectric capacitor 21 will start to flip its polarization as power increases. The change in polarization gives rise to a charge that is released and stored on capacitor 34, thereby raising the potential at the input to switch 33. If capacitor 34 is correctly chosen, the increase in potential on line 25 will be sufficient to cause switch 33 to conduct, thereby lowering the potential on node 26. Node 26 will remain at an intermediate potential between ground and V as long as ferroelectric capacitor 21 is changing state. Once ferroelectric capacitor 21 changes state completely, no additional charge will be stored on capacitor 34. The charge on capacitor 34 will then leak off at a rate determined by the leakage current in switch 33. At this point, switch 33 will again become non-conducting, and node 26 will rise to V. Hence, autonomous memory circuit 30 behaves in a manner analogous to autonomous memory circuit 20 discussed above. That is, during power up, the output signal can be monitored to determine the state of ferroelectric capacitor 21 prior to power up. After power up has been completed, the output will be high and ferroelectric capacitor 21 will be in the up state.

Figure 4:
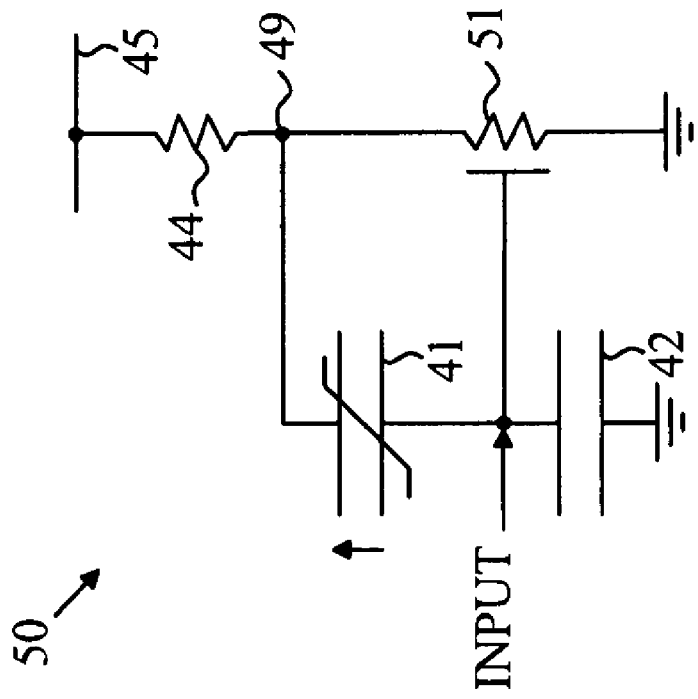
FIG. 4 is a schematic drawing of an autonomous memory circuit that utilizes a ferroelectric FET 51 as the switching element.
Figure 3:
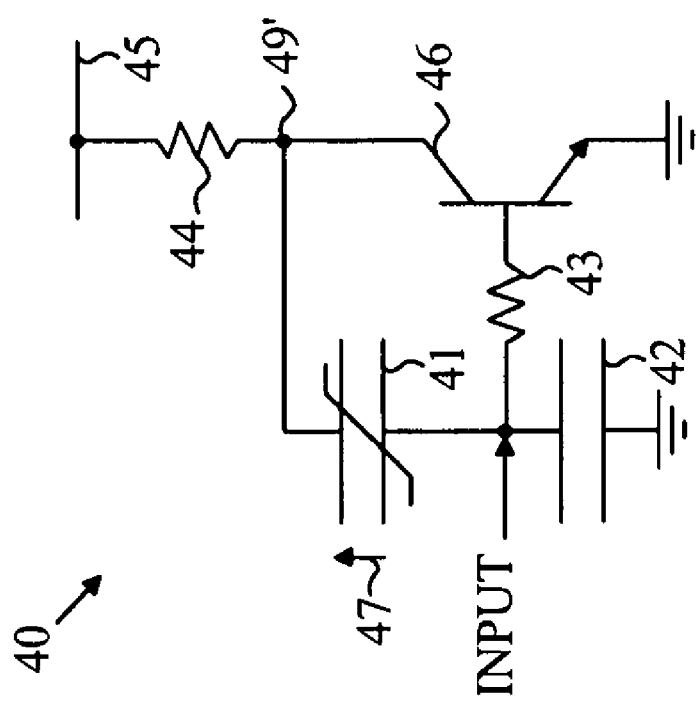
FIG. 3 illustrates an NPN transistor 46 having a base resistance 43 as the switch.

The above-described embodiments of an autonomous memory circuit according to the present invention utilize a switch to alter the state of the ferroelectric capacitor at power up. However, an amplifier or other variable resistance device could be utilized. Refer now to FIGS. 3 and 4, which are schematic drawings of two embodiments of an autonomous memory circuit according to one aspect of the present invention in which an analog device is used in place of the switches discussed above. Autonomous memory circuit 40 shown in FIG. 3 utilizes as the switch an NPN transistor 46 having a base resistance 43. The conductive load is a resistor 44. On power up, capacitor 42 converts any charge displaced from ferroelectric capacitor 41 to a voltage that controls the collector to emitter resistance of transistor 46. The discharge time for capacitor 42 is controlled by resistor 43 and determines the time over which the potential at node 49' remains below the potential on bus 45 during start up if the initial state of ferroelectric capacitor 41 is polarized down. After power up, the state of ferroelectric capacitor 41 will be in the up polarization state as indicated by arrow 47. In some cases, proper selection of the values of resistor 44, ferroelectric capacitor 41, and resistor 43 will allow the circuit to work properly without capacitor 42.

Refer now to FIG. 4, which is a schematic drawing of an autonomous memory circuit that utilizes a ferroelectric FET 51 as the switching element. Autonomous memory circuit 50 operates in a manner analogous to autonomous memory circuit 40 discussed above with respect to FIG. 3. Ferroelectric FET 51 provides a variable resistance between node 49 and ground that is controlled by the potential on the input node. Ferroelectric FETs are known to the art, and hence, will not be discussed in detail here. The reader is directed to U.S. Pat. No. 5,070,385 for a more detailed description of these devices. A ferroelectric FET can be fabricated in the same fabrication system as ferroelectric capacitor 41 allowing them to be built simultaneously at reduced cost. It should also be noted that the ferroelectric devices do not require a crystalline substrate such as a silicon wafer. The devices can be fabricated on any substrate that can withstand the fabrication temperatures, and hence, the entire circuit can be fabricated on a non-crystalline substrate, which substantially reduces the cost of fabrication.

The operation of the autonomous memory circuits discussed above can be divided into a program mode and a readout mode. In the program mode no external power is required on bus 45 and capacitor 42 is not necessary. Refer again to FIG. 3, and assume that ferroelectric capacitor 41 has been reset to the up state prior to entering program mode by a previous readout of autonomous memory circuit 40. If a positive pulse having a sufficient voltage to reset ferroelectric capacitor 41 is applied at the input, the state of ferroelectric capacitor 41 will change to the down state and remain there until the state is changed. The positive input pulse causes the polarization of ferroelectric capacitor 41 to flip, which results in a current flowing into transistor 46 from node 49. The positive pulse also turns on transistor 46 through resistor 43 so that the current resulting from the reset of ferroelectric capacitor 41 is shunted to ground through the collector/emitter path of transistor 46. The new state will remain stored in ferroelectric capacitor 41 without any power or external circuitry being connected to autonomous memory circuit 40 until ferroelectric capacitor 41 is reset at readout. If a positive pulse is applied to node 49 while the circuit is powered down, ferroelectric capacitor 41 will be switched up if it is not already up. Hence, autonomous memory circuit 40 is well suited for recording events in the field for later readout, in that autonomous memory circuit 40 requires no power while in the recording mode other than the power provided by the programming source. Furthermore, the power required by the programming source is very small. The only current that flows during programming is the current represented by the charge that is displaced from ferroelectric capacitor 41 when ferroelectric capacitor 41 flips states plus the leakage current through the base of transistor 46. The power draw from the programming source can be less than a microwatt with the proper choice of transistor.

Autonomous memory circuit 40 will automatically reset to the up state by powering up autonomous memory circuit 40. Resistor 44 and the extent to which the transistor is turned on during programming determine the power drawn during the power up phase. Again the power requirements can be quite small, and hence, a signal from a device that is being monitored may be sufficient to reset the device. Once reset, power drain is low since transistor 46 is off.

Figure 5B:
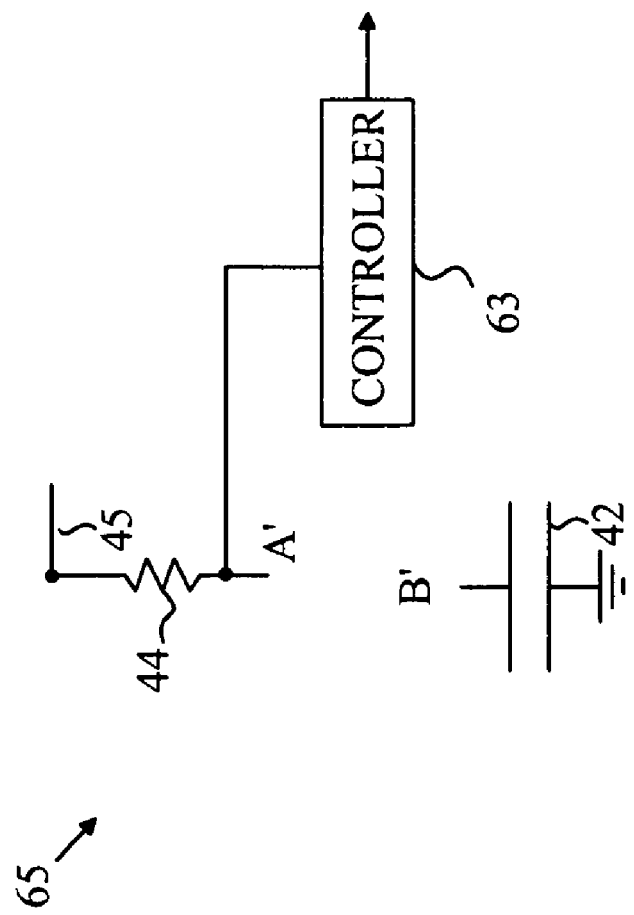
FIGS. 5A and 5B illustrate an autonomous memory circuit system.
Figure 5A:
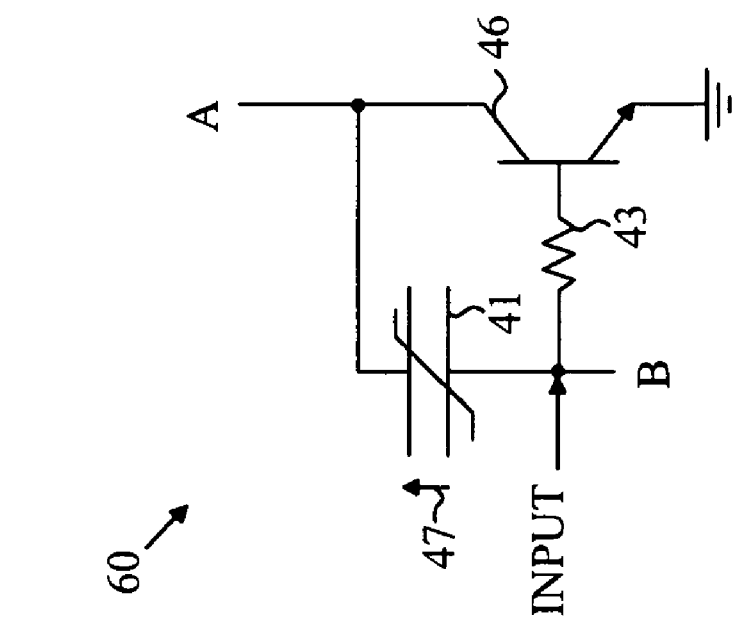

Refer now to FIGS. 5A and 5B, which illustrate an autonomous memory circuit system. FIG. 5A is a schematic drawing of one embodiment of a field unit according to the present invention, and FIG. 5B is a schematic of a readout circuit for reading out the state of field units such as field unit 60 shown in FIG. 5A. Field unit 60 includes the ferroelectric capacitor 41 and the switching element 46 as described above. Readout unit 65 provides the resistive load 44, the charge-to-voltage converter 42 and a controller 63 that measures the potential on node A' when power is applied to bus 45. Field unit 60 is connected to readout unit 65 by connecting terminals A and B of field unit 60 to terminals A' and B', respectively, of readout unit 65.

The autonomous memory circuit of the present invention can also be utilized to construct a non-volatile latch. The autonomous memory circuit embodiments discussed above assume a state after power up that is the "up" state regardless of the state of the ferroelectric capacitor prior to the application of power to the autonomous memory circuit. To provide a latch function so the data is not destroyed during power up, a feedback circuit of some type must be provided to reset the state of the ferroelectric capacitor to the down state if the ferroelectric capacitor was in the down state when power was applied.

Figure 6:
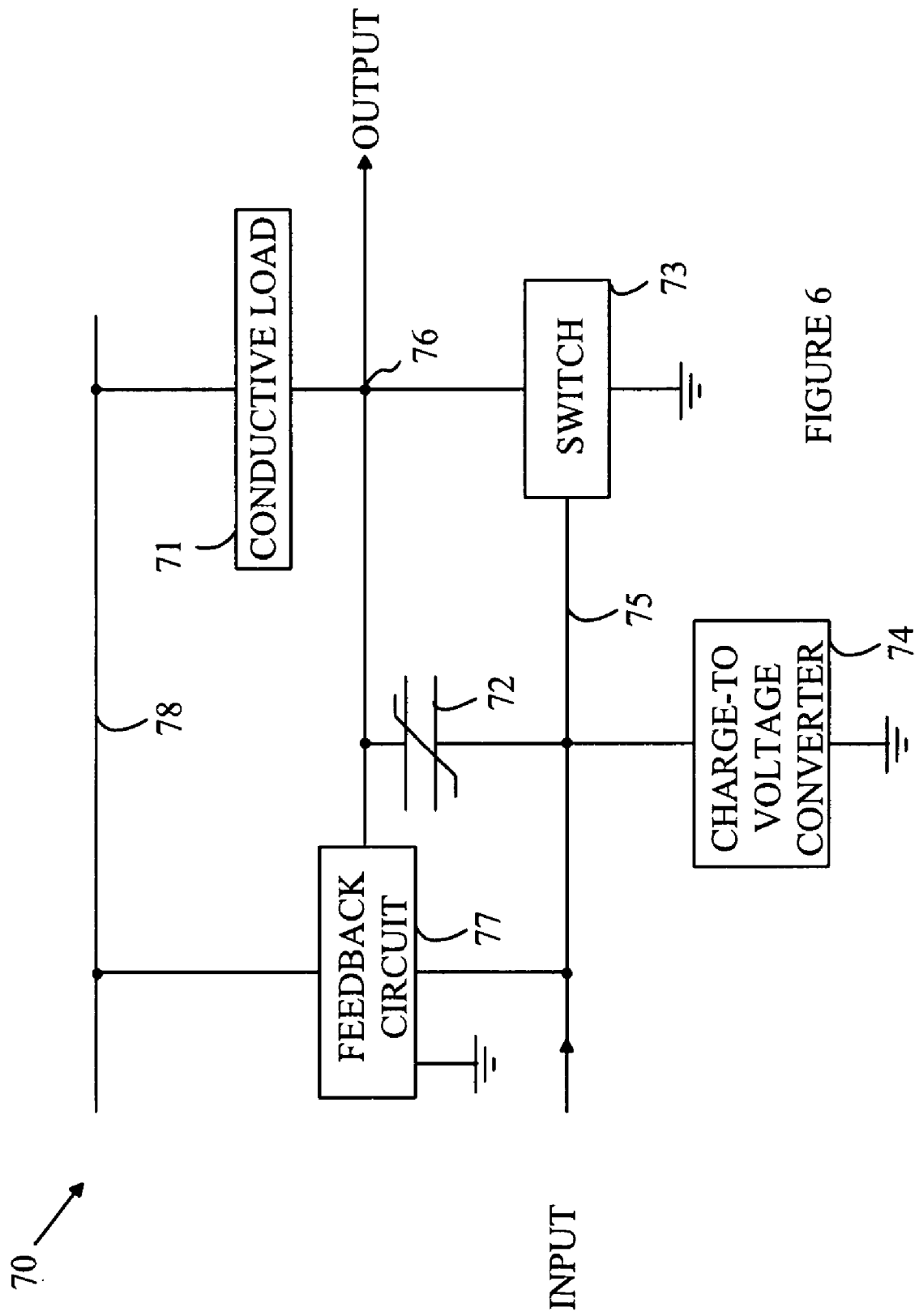
FIG. 6 is a block diagram of a non-volatile latch that utilizes a feedback path based on one aspect of the present invention.

In one aspect of the present invention, a feedback path is provided from the output of the autonomous memory circuit to the control input of the switch/amplifier. Refer now to FIG. 6, which is a block diagram of a non-volatile latch 70 that utilizes a feedback path based on this aspect of the present invention. Feedback circuit 77 in latch 70 measures the difference in potential between node 76 and power rail 78 as the autonomous memory circuit powers up. If the potential difference across load 71 is greater than a predetermined threshold value, feedback circuit 77 generates a signal on line 75 that causes switch 73 to enter the conducting state and ferroelectric capacitor 72 to set to the down state. With switch 73 on, the control input for feedback circuit 77 is held permanently on and the circuit latches.

Figure 7:
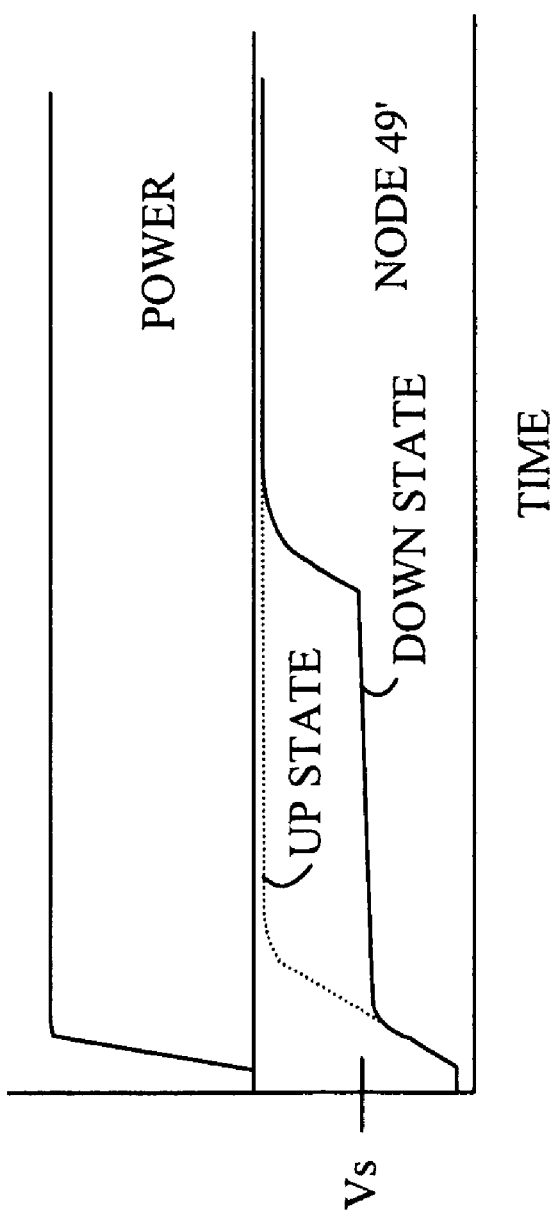
FIG. 7 illustrates the potential on the power rail and on node 49' shown in FIG. 3 when a memory circuit according to one embodiment is powered up.

Refer now to FIG. 7, which illustrates the potential on the power rail and on node 49' shown in FIG. 3 as a function of time when autonomous memory circuit 40 is powered up with ferroelectric capacitor 41 in the up and down state. If ferroelectric capacitor 41 is in the down state when circuit 40 is powered up, the potential on node 49' initially increases with the power rail potential until the potential at node 49' reaches a value that causes ferroelectric capacitor 41 to begin to change polarization state. As ferroelectric capacitor 41 begins to flip polarization, charge is released that causes transistor 46 to begin to conduct. If transistor 46 begins to conduct too much, the potential on node 49' begins to drop and ferroelectric capacitor 41 stops switching. If transistor 46 does not conduct enough, the potential on node 49' rises faster causing ferroelectric capacitor 41 to switch faster forcing more current into the control input of transistor 46 increasing its conductivity. Thus, the circuit stabilizes with the potential of node 49 at a specific intermediate value with a slow rate of rise. In this manner, the change in conductivity of transistor 46 limits the voltage rise at node 49' until the change in state of ferroelectric capacitor 41 is completed. At this point, no further charge will be released from ferroelectric capacitor 41, and hence, transistor 46 will again become non-conducting. The potential during the transition of ferroelectric capacitor 41 will be referred to as the "shelf voltage", $V_s$, in the following discussion. The specific shape of the potential at node 49', or the analogous node in autonomous memory circuits based on other forms of switches, will, in general, depend on the specific switch implementation.

Referring again to FIG. 7, and in particular the dotted curve, the potential on the power rail and on node 49' shown in FIG. 3 is shown as a function of time when autonomous memory circuit 40 is powered up with ferroelectric capacitor 41 in the up state. Since ferroelectric capacitor 41 does not switch on at power up, little current flows into the control input of transistor 46 and transistor 46 never conducts. The potential on node 49 immediately rises to the voltage on the power rail 45.

It is important to note that if another circuit is attached to the output at node 49 during the power up sequence, the power voltage applied to the power rail 45 must be high enough that the voltage drop across conductive load 44, due to the combined draw of current to power the read of ferroelectric capacitor 41 as well as to power the input of the external circuit attached to node 49, will still allow node 49 to rise high enough to complete its read operation of ferroelectric capacitor 41.

Refer again to FIG. 6. As noted above, if ferroelectric capacitor 72 is in the down state at power up, the potential on node 76 will be less than that on power rail 78 for the period of time needed for the state of ferroelectric capacitor 72 to switch to the up state. The specific value for the shelf voltage and the duration of the intermediate state will depend on the properties of switch 73, ferroelectric capacitor 72, and charge-to-voltage converter 74. The feedback circuit must detect the difference between $V_s$ and power rail 78. Feedback circuit 77 turns on switch 73 if the potential difference between 78 and node 76 is greater than a threshold value but does not turn on switch 73 if that potential difference is less than that threshold value. The threshold voltage for the feedback device must be such that feedback circuit 77 does not make its decision until ferroelectric capacitor 72 begins to switch.

Figure 8:
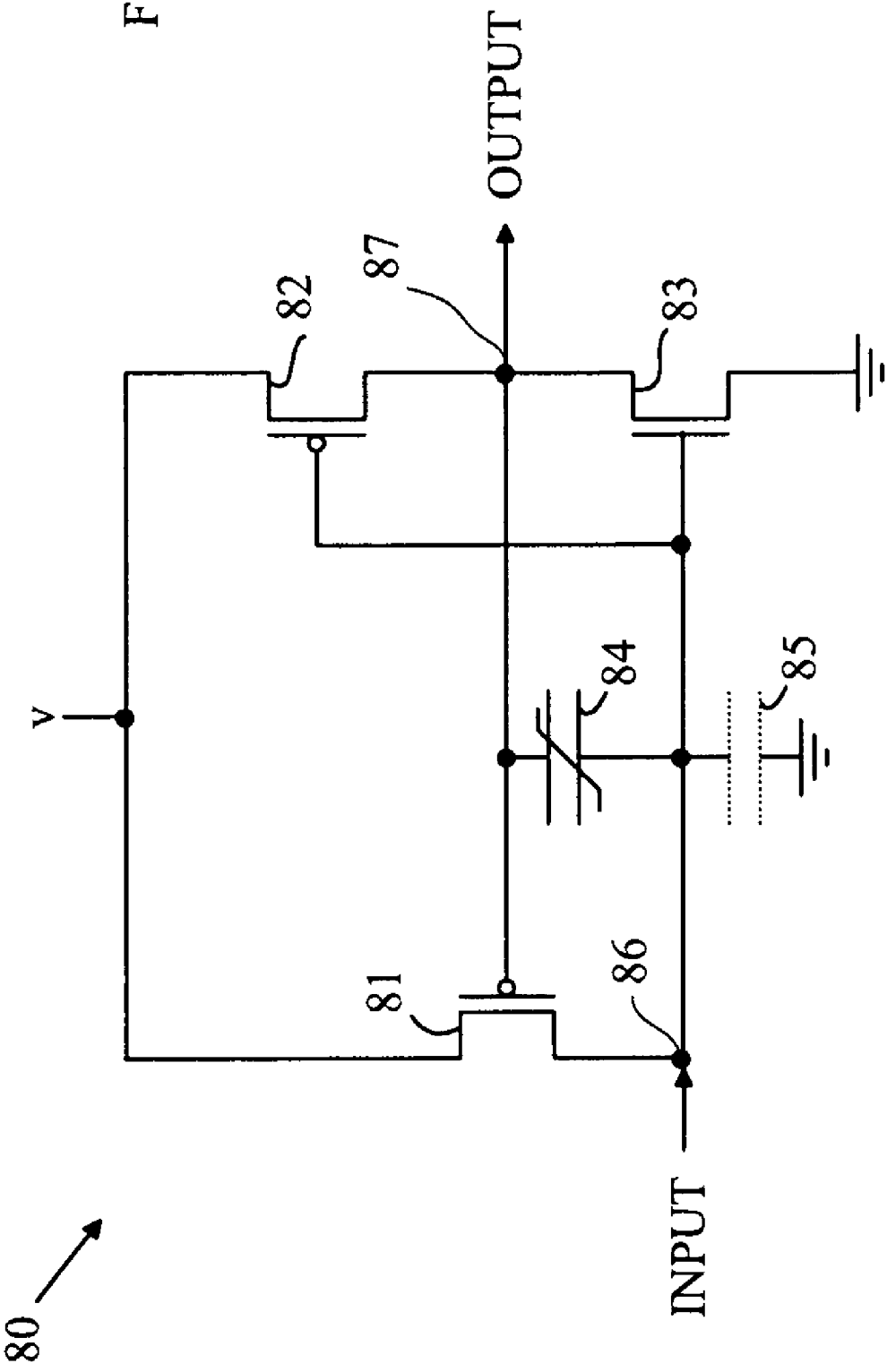
FIG. 8 is a schematic drawing of one embodiment of a non-volatile latch according to the present invention.

Refer now to FIG. 8, which is a schematic drawing of one embodiment of a non-volatile latch 80 according to the present invention. Transistor 82 acts as the conducting load in latch 80. During power up, the potential on the gate of transistor 81 will either be V or $V_s$, the shelf voltage. If the potential is V, transistor 81 stays totally OFF, and hence, transistor 81 provides a high impedance. In this case, transistor 81 never turns ON and transistor 83 stays OFF. OUTPUT goes high and ferroelectric capacitor 84 remains programmed in the UP state.

If the $V_s$ is generated at node 87, transistor 81 is subjected to a negative potential between the drain and gate that is sufficient to turn transistor 81 on, and hence, transistor 81 provides a very low impedance if the shelf voltage is generated at node 87. If transistor 81 turns on, transistor 83 turns on, pulling node 86 to V and node 87 to ground, and hence, applying all of V to ferroelectric capacitor 84 to switch ferroelectric capacitor 84 back to the DOWN state.

The threshold criteria described above is met by designing the circuit so that the difference between the shelf voltage, $V_s$ and V is greater than the threshold voltage of transistor 81.

The charge-to-voltage conversion function is provided by capacitor 85. A conventional capacitor can be utilized here if the parasitic capacitance of the node and the gate capacitance of transistor 83 are insufficient. A ferroelectric capacitor could also be used for the sense capacitor in any of the embodiments where a sense capacitor is needed.

Latch 80 can be programmed while latch 80 is powered by pulling node 87 to ground to turn on transistor 81 or pulling node 86 to ground to turn off transistor 81. While Power is OFF, ferroelectric capacitor 84 can still be programmed by applying a potential to either node 86 or 87. If node 87 is forced high, the OUTPUT will be high when the latch powers up. If node 86 is forced high, the OUTPUT will be low when the latch powers up.

Figure 9:
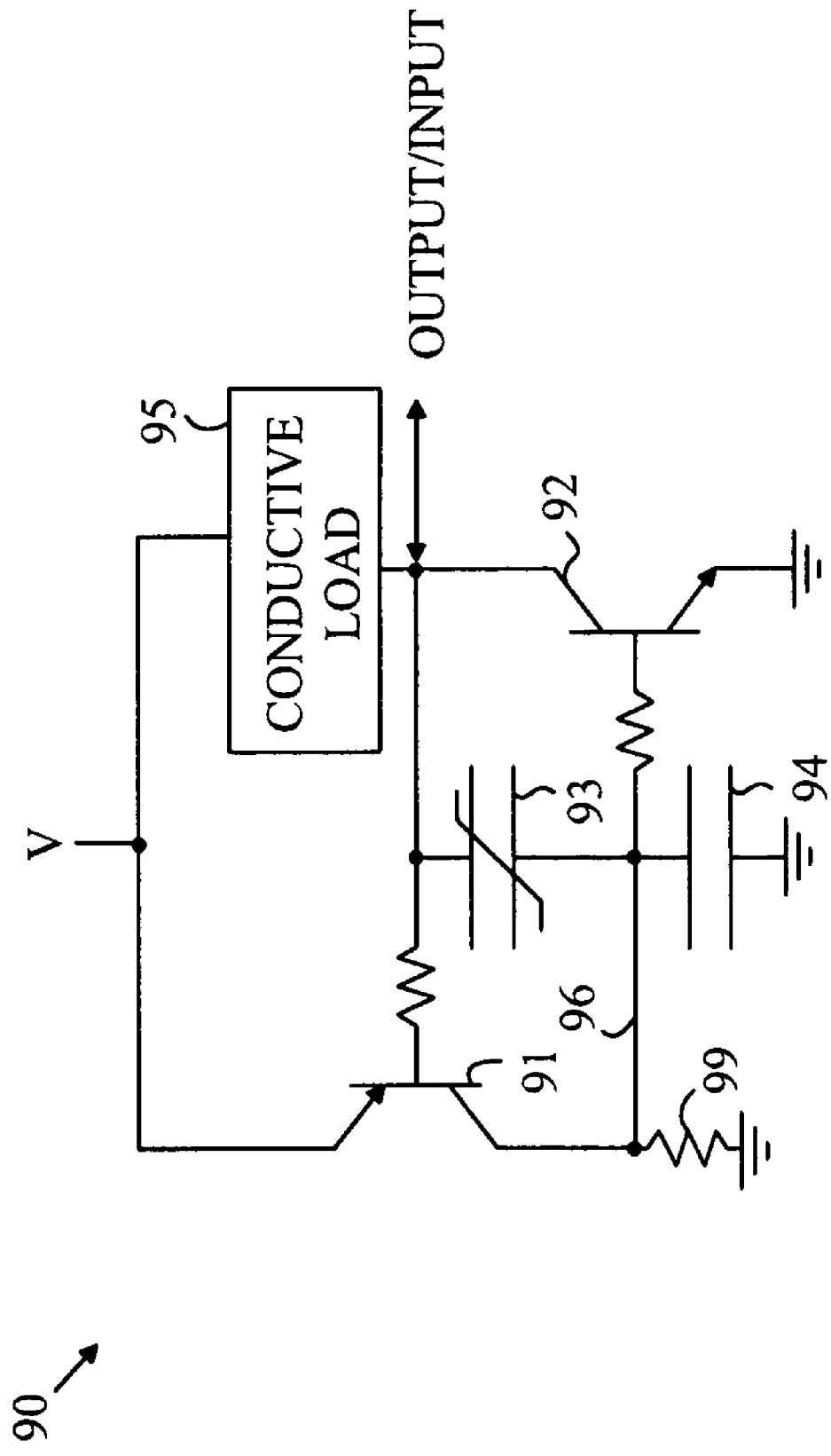
FIG. 9 illustrates another embodiment of a latch according to the present invention.

Refer now to FIG. 9, which illustrates another embodiment of a latch according to the present invention. Latch 90 is constructed from bipolar transistors and operates in a manner analogous to that described above with respect to latch 80. The state of latch 90 is stored in ferroelectric capacitor 93, and capacitor 94 converts the charge leaving ferroelectric capacitor 93 to a voltage that operates NPN transistor 92. The feedback path is provided by PNP transistor 91. Conductive load 95 can be a resistor or other load.

It should be noted that the off impedance of transistor 91 in latch 90 and or transistor 81 in latch 80 can be so high that the node 96 and the corresponding node in latch 80 may float if the latch output is high, making node 96 susceptible to static charges while the circuit is on. This situation can be remedied by including a pull-down device such as resistor 99 to discharge capacitor 94 when transistor 91 is in the non-conducting state. The pull-down device must be a very high value resistor, a reversed bias diode (which is easy to build in MOS), or a pull down switch turned-on by the output at a voltage above that which turns ON transistor 91. In the case of a pull down switch, the switch should only turn on if the output goes to V.

In the above-described embodiments, the feedback path was constructed from a single transistor or switching device. This was made possible because the transistor technologies provided bipolar devices. For example, latch 90 could make use of both NPN and PNP transistors. If the technology used to provide the switches is unipolar, the feedback path requires an additional switch or transistor. For example the ferroelectric FETs discussed above with reference to FIG. 4 are analogous to N-channel enhancement FETs or N-channel depletion FETs. A ferroelectric FET with enhancement for a negative gate voltage does not exist yet. Hence, a different form of feedback path must be utilized.

Figure 10:
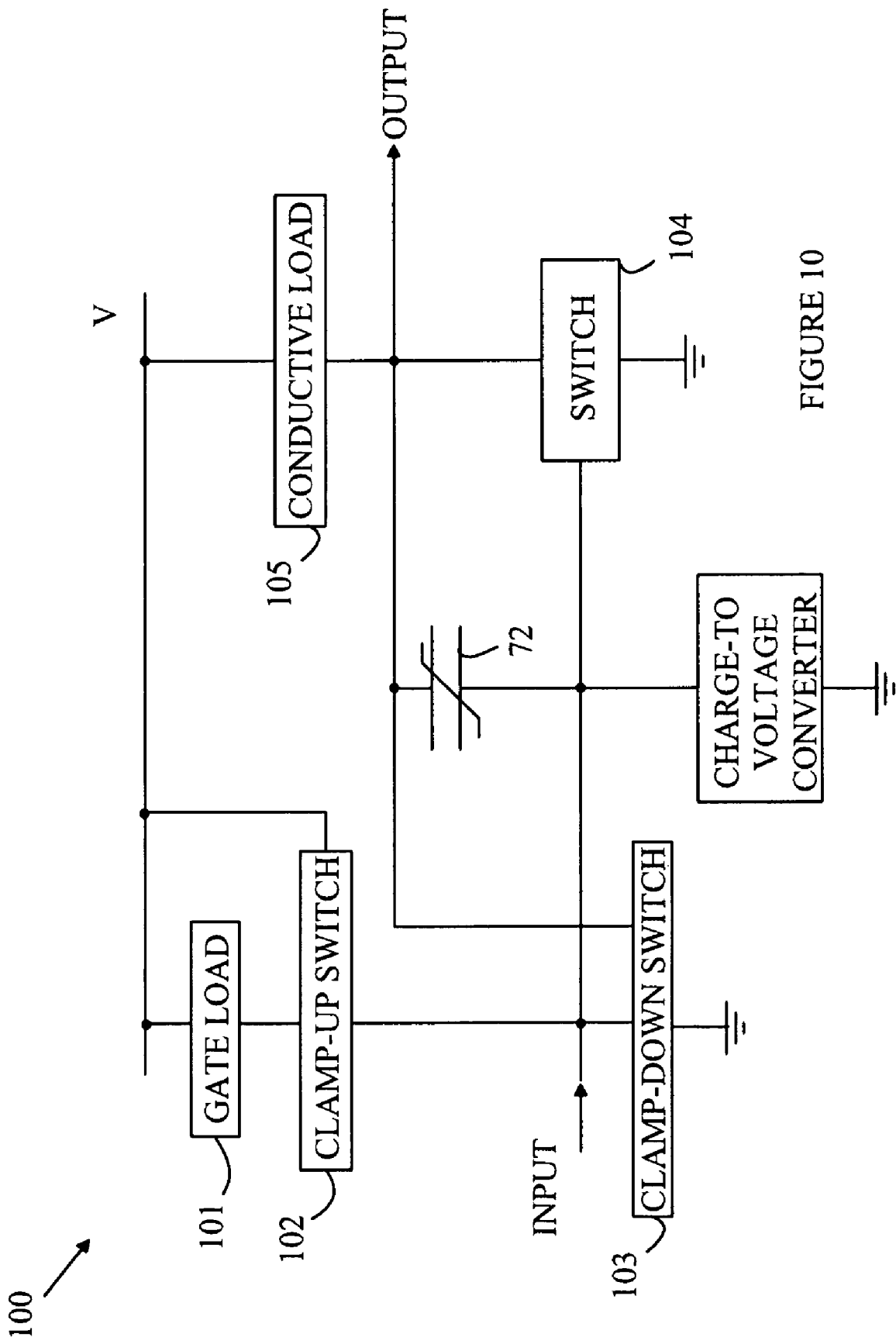
FIG. 10 illustrates another embodiment of a latch according to the present invention.

Refer now to FIG. 10, which illustrates another embodiment of a latch according to the present invention. Latch 100 is constructed from unipolar switching devices. Conductive load 105, switch 104, ferroelectric capacitor 72 form the autonomous memory cell portion of latch 100. The two clamp switches 102 and 103 compare V to the output to determine if the shelf voltage occurs during the power up of latch 100 and set the state of the memory switch accordingly. Clamp-up switch 102 and clamp-down switch 103 both have thresholds and are the same type of switch (unipolar). For example, the two clamp switches could be constructed from enhancement switches that are off when no voltage is applied to their control inputs. This is the functionality of N-channel FETs, NPN bipolar transistors, or ferroelectric FETs.

Clamp-down switch 103 has a threshold above the shelf voltage but below that of clamp-up switch 102. If the shelf voltage occurs, the turn-on of clamp-down switch 103 is delayed but clamp-up switch 102, which is triggered by V, turns on to turn-on switch 104 and pull the output down plus ensure that clamp-down switch 103 never turns on. If the shelf voltage does not occur, i.e., ferroelectric capacitor 72 was polarized in the up state before power is applied, clamp-down switch 103 turns on before clamp-up switch 102, and hence, keeps switch 104 off and the output in the high state. Clamp-up switch 102 does eventually turn on after clamp-down switch 103 in this situation; however, gate load 101 ensures that clamp-up switch 102 cannot overpower clamp-down switch 103. Gate load 101 also limits power consumption by the clamp switches.

Figure 11:
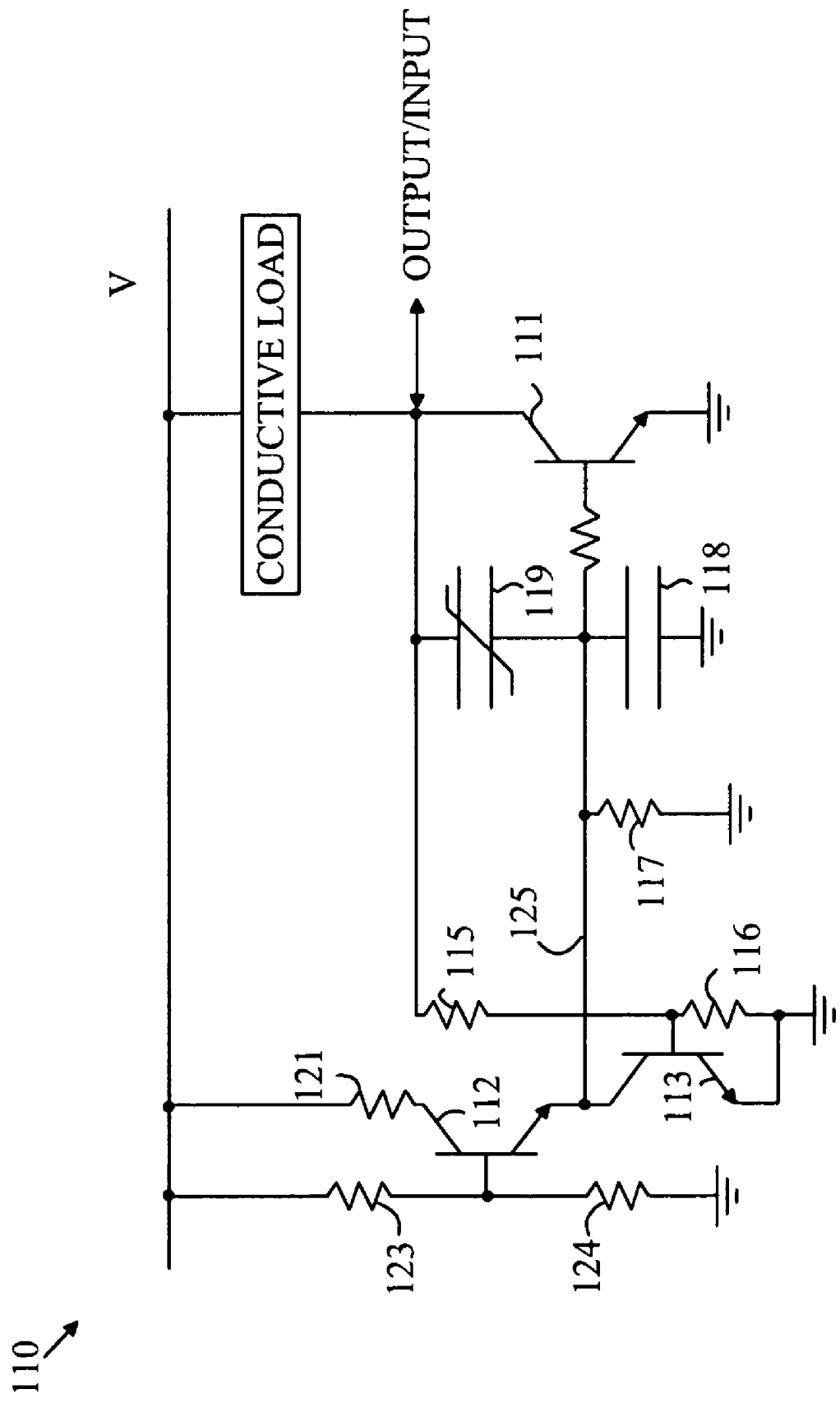
FIG. 11 illustrates a unipolar latch according to another embodiment of the present invention.

Refer now to FIG. 11, which illustrates a unipolar latch according to another embodiment of the present invention. Latch 110 is constructed solely from NPN transistors. The clamp-up switch is constructed from NPN transistor 112 that is biased via resistors 123 and 124, and has a gate load provided by resistor 121. The clamp-down switch is constructed from NPN transistor 113 that has a threshold set by the resistive divider constructed from resistors 115 and 116. Resistor 117 provides a finite leakage path to prevent node 125 from floating when transistors 112 and 113 are off. The charge-to-voltage conversion is performed by capacitor 118 that receives the charge flowing from ferroelectric capacitor 119 when ferroelectric capacitor 119 changes state. Switch 104 shown in FIG. 10 is implemented by NPN transistor 111.

Figure 12:
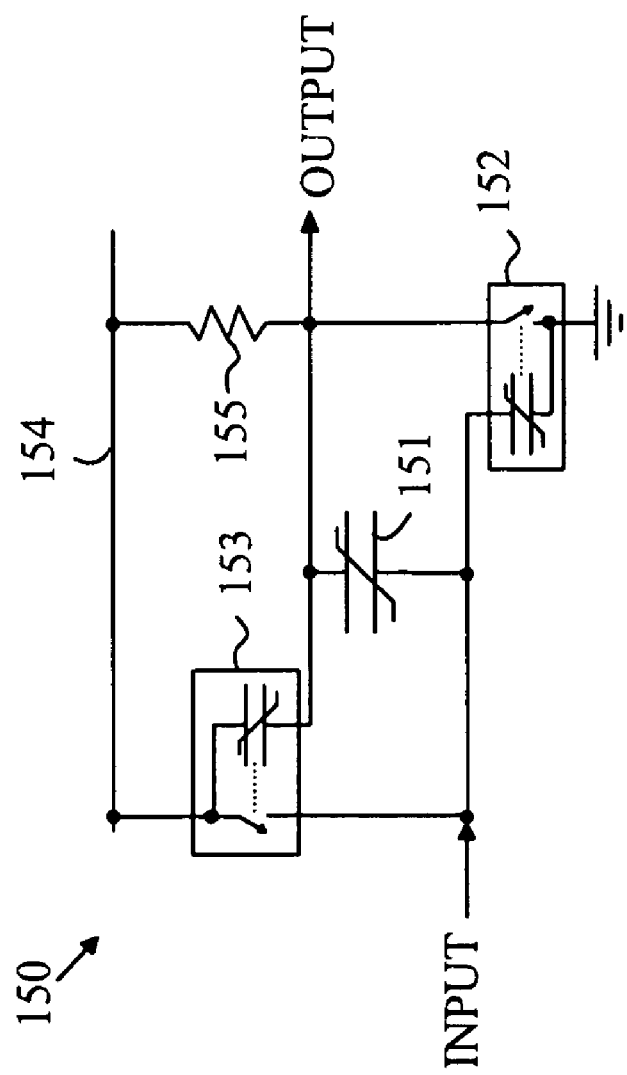
FIG. 12 illustrates another embodiment of a latch according to the present invention.

The above-described embodiments utilize switches that are constructed from transistors. However, the switches could also be constructed from relays or electromechanical devices. Refer now to FIG. 12, which illustrates a latch according to another embodiment of the present invention. Latch 150 utilizes ferroelectric relay 152 for the switching function represented by switch 73 in FIG. 6, and ferroelectric relay_153 for the feedback circuit 77 described in FIG. 6.

Figure 13:
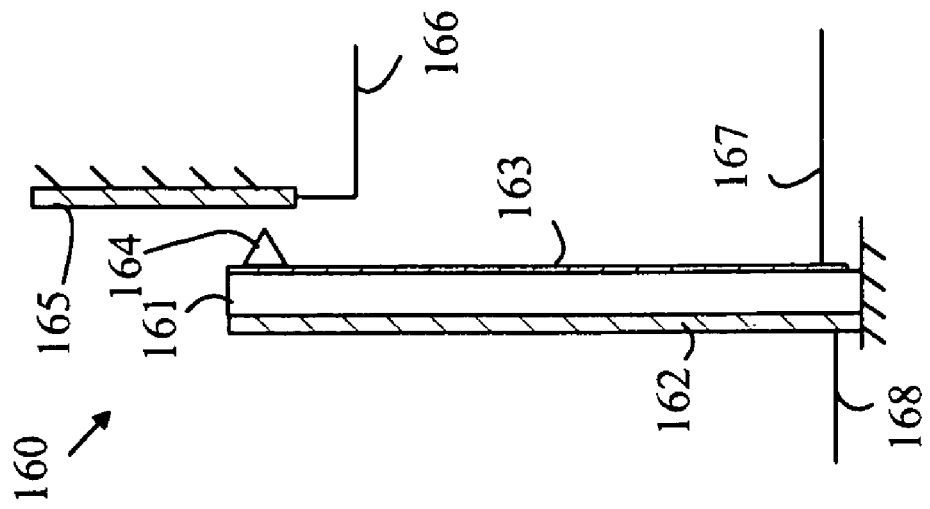
FIG. 13 illustrates one embodiment of a ferroelectric relay that could be utilized in the embodiment shown in FIG. 12.

Ferroelectric relays are well known in the art, and hence, these relays will not be discussed in detail here. For the purposes of the present discussion, an exemplary ferroelectric relay is shown in FIG. 13; however, many other embodiments of such relays could be utilized in the present invention. Ferroelectric relay 160 is constructed from a layer of ferroelectric material 161 that is sandwiched between two electrodes 162 and 163. For the purpose of this example, it will be assumed that electrode 162 cannot significantly change its length in response to a change in length of layer 161, and hence, when layer 161 changes in length, electrode 162 bends such that contact 164 moves toward electrode 165 or away therefrom depending on the whether layer 161 increases or decreases in length. Layer 161 is polarized such that contact 164 will contact electrode 165 when a potential is applied between electrodes 162 and 163 due to the length of layer 161 becoming shorter in response to the applied electric field. When no potential is applied between the electrodes, contact between contact 164 and electrode 165 is broken.

Ferroelectric relay 160 can be used for relay 153 shown in FIG. 12 by connecting lead 166 to INPUT, lead 168 to OUTPUT and lead 167 to power rail 154. Similarly, ferroelectric relay 160 can be used for relay 152 by connecting lead 167 to ground, lead 168 to INPUT, and 166 to OUTPUT. The switching potential is provided by the charge that is displaced from ferroelectric capacitor 151 when the polarization of that capacitor is being switched.

It should be noted that layer 161 and electrodes 162 and 163 also form a ferroelectric capacitor. Hence, by the proper choice of the relative capacitances of ferroelectric capacitor 151 and the capacitors in ferroelectric relays 152 and 153, the charge that is switched from ferroelectric capacitor 151 when ferroelectric capacitor 151 changes state will be sufficient to switch the state of ferroelectric relays 152 and 153. In one embodiment of the present invention, the relative capacitances are controlled by controlling the relative areas of the capacitors. It should also be noted that the ferroelectric capacitor in ferroelectric relay 152 also serves the function of the charge-to-voltage converter discussed above, and hence, no additional charge to voltage converter is needed.

It should be noted that there is a capacitive circuit from the power rail 154 all the way to ground through the three ferroelectric capacitors associated with elements 151-153. By proper selection of the sizes of the three capacitors, conductive load 155 could be eliminated.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent to those skilled in the art from the foregoing description and accompanying drawings. Accordingly, the present invention is to be limited solely by the scope of the following claims.

What is claimed is:

1. A circuit comprising:
    a ferroelectric capacitor characterized by first and second polarization states;
    a variable impedance element having a switch impedance between first and second switch terminals that is determined by a signal on a control terminal, said ferroelectric capacitor being connected between said control terminal and said first switch terminal,
    wherein when a potential difference is applied between said first and second switch terminals, a current flows between said first switch terminal and said second switch terminal that varies in a manner determined by said state of polarization of said ferroelectric capacitor.

2. The circuit of claim 1 further comprising a charge-to-voltage converter between said control terminal and said second switch terminal.

3. The circuit of claim 1 further comprising a conductive load connected between a first power terminal and said first switch terminal, said second switch terminal being connected to a second power terminal.

4. The circuit of claim 3 wherein said conductive load has an impedance determined by said signal on said control terminal.

5. The circuit of claim 1 wherein said variable impedance element is chosen from the group consisting of bipolar transistors, ferroelectric FETs, FETs, amplifiers, ferroelectric relays, ferromagnetic relays and electrostatic MEMs switches.

6. The circuit of claim 1 wherein said switch impedance changes as a function of a potential on said control terminal and wherein said circuit comprises a charge-to-voltage converter connected to said control terminal.

7. The circuit of claim 6 wherein said charge-to-voltage converter comprises a capacitor having a ferroelectric dielectric material.

8. The circuit of claim 3 wherein said polarization state switches from said first state to said second state in response to a potential difference being applied between said first and second power terminals and wherein said circuit further comprises a feedback circuit that resets said polarization state to said first polarization state if said polarization state switches from said first state to said second state in response to said applied potential difference.

9. The circuit of claim 8 wherein said feedback circuit comprises a feedback element that measures a startup potential between said first switch terminal and said first power terminal when said potential difference is applied between said first and second power terminals and sets said polarization state to said first polarization state based on said startup potential.

10. The circuit of claim 8 wherein said variable impedance element comprises a bipolar device of a first type and said feedback element comprises a bipolar device of the opposite type.

11. The circuit of claim 10 wherein said bipolar device comprises a bipolar transistor.

12. The circuit of claim 10 wherein said bipolar device comprises a MOSFET.

13. The circuit of claim 8 wherein said feedback circuit comprises a first ferroelectric relay characterized by a first capacitance.

14. The circuit of claim 8 wherein said feedback circuit comprises a device chosen from the group consisting of bipolar transistors, ferroelectric FETs, FETs, amplifiers, ferroelectric relays, ferromagnetic relays and electrostatic MEMs switches.

15. The circuit of claim 13 wherein said variable impedance element comprises a second ferroelectric relay having a capacitance that depends on said first capacitance.

16. The circuit of claim 8 wherein said feedback circuit comprises a feedback load and first and second feedback switches, said feedback load being connected to said control terminal by said first feedback switch in response to said applied potential difference and said second feedback switch connecting said control terminal to said second power terminal in response to said potential on said first switch terminal of said variable impedance element being at a potential greater than a predetermined threshold value.

17. The circuit of claim 16 wherein said first power terminal is at a first power potential when said potential difference is applied and wherein said predetermined threshold value is less than said first power potential.

18. The circuit of claim 16 wherein said variable impedance element and said first and second feedback switches comprise switches of the same type.

19. The circuit of claim 17 wherein said switches are chosen from the group consisting of N-channel FETs, NPN bipolar transistors, or ferroelectric FETs.

20. A circuit comprising:
    a first ferroelectric capacitor; and
    a ferroelectric relay having a switch that is controlled by a second ferroelectric capacitor, said switch having first and second switch terminals, said first switch terminal being connected to said second switch terminal when said second ferroelectric capacitor has a first polarization state and said first switch terminal being disconnected from said second switch terminal when said ferroelectric capacitor has a second polarization state, wherein
    said first ferroelectric capacitor is connected in series with said second ferroelectric capacitor;
    said first ferroelectric capacitor is connected to said first switch terminal; and
    said second ferroelectric capacitor is connected to said second switch terminal.

21. The circuit of claim 20 wherein said first ferroelectric capacitor has a capacitance chosen such that a charge released from said first ferroelectric capacitor when said first ferroelectric capacitor changes polarization states is sufficient to cause said second ferroelectric capacitor to change polarization states.

22. A method for determining the state of a ferroelectric capacitor that is characterized by first and second polarization states, said method comprising:
- providing a variable impedance element having a switch impedance between first and second switch terminals that is determined by a signal on a control terminal, said ferroelectric capacitor being connected between said control terminal and said first switch terminal,
- applying a potential difference between said first and second switch terminals; and
- measuring a current that flows between said first switch terminal and said second switch terminal to determine said polarization state of said ferroelectric capacitor.

23. The method of claim 22 further comprising converting a charge leaving said ferroelectric capacitor to a voltage that is applied to said control terminal.

24. The method of claim 22 wherein said polarization state switches from said first state to said second state in response to a potential difference being applied between first and second power terminals and wherein said method further comprises resetting said polarization state to said first polarization state if said polarization state switches from said first state to said second state in response to said applied potential difference.

* * * * *